(12) United States Patent
Lee et al.

(10) Patent No.: US 10,079,363 B2
(45) Date of Patent: Sep. 18, 2018

(54) MIRROR DISPLAY DEVICE

(71) Applicant: Samsung Display Co., Ltd, Yongin-si, Gyeonggi-do (KR)

(72) Inventors: Daewoo Lee, Hwasenog-si (KR); Byoungki Kim, Seoul (KR); Hojin Yoon, Hwaseong-si (KR); Yun-mo Chung, Yongin-si (KR)

(73) Assignee: Samsung Display Co., Ltd. (KR)

( * ) Notice: Subject to any disclaimer, the term of this patent is extended or adjusted under 35 U.S.C. 154(b) by 1 day.

(21) Appl. No.: 15/048,755

(22) Filed: Feb. 19, 2016

(65) Prior Publication Data

US 2016/0308168 A1    Oct. 20, 2016

(30) Foreign Application Priority Data

Apr. 17, 2015 (KR) .................. 10-2015-0054481

(51) Int. Cl.
   *H01L 51/52* (2006.01)
   *H01L 27/32* (2006.01)
(52) U.S. Cl.
   CPC ...... *H01L 51/5271* (2013.01); *H01L 27/3246* (2013.01); *H01L 51/5281* (2013.01)
(58) Field of Classification Search
   CPC .................. H01L 51/5271; H01L 27/3246
   See application file for complete search history.

(56) References Cited

U.S. PATENT DOCUMENTS

| 9,117,403 | B2* | 8/2015 | Omoto | H01L 51/5225 |
| 9,634,073 | B2* | 4/2017 | Oh | H01L 27/3258 |
| 2005/0013334 | A1* | 1/2005 | Watanabe | H01S 5/18311 |
| | | | | 372/44.01 |
| 2012/0299472 | A1 | 11/2012 | Chung et al. | |
| 2013/0069046 | A1* | 3/2013 | Ishizuya | H01L 51/5271 |
| | | | | 257/40 |
| 2015/0270511 | A1* | 9/2015 | Kaneko | H01L 27/32 |
| | | | | 257/40 |

FOREIGN PATENT DOCUMENTS

| JP | 2014-032312 | 2/2014 |
| KR | 1999-0001351 | 1/1999 |
| KR | 10-0564219 B1 | 3/2006 |
| KR | 10-1146449 | 5/2012 |
| KR | 10-2014-0073216 A | 6/2014 |
| KR | 10-1451568 | 10/2014 |

* cited by examiner

*Primary Examiner* — Fernando L Toledo
*Assistant Examiner* — Valerie N Newton
(74) *Attorney, Agent, or Firm* — Innovation Counsel LLP

(57) ABSTRACT

A mirror display device includes a first base substrate, a light emitting layer, a mirror layer, and a second base substrate. The light emitting layer is provided on the first base substrate. A mirror layer is provided on the light emitting layer and reflects a shape of an object. The second base substrate is provided on the mirror layer. The light emitting layer may have a circular shape in a plan view.

20 Claims, 9 Drawing Sheets

MIRROR DISPLAY DEVICE

CROSS-REFERENCE TO RELATED APPLICATIONS

This U.S. non-provisional patent application claims priority under 35 U.S.C. § 119 of Korean Patent Application No. 10-2015-0054481, filed on Apr. 17, 2015, the entire contents of which are hereby incorporated by reference.

BACKGROUND

The present disclosure herein relates to a mirror display device, and particularly to, a mirror display device with improved display quality.

Recently, mirror display devices that have the combined functions of a display panel and a mirror have been proposed. Specifically, when the mirror display device displays an image, it functions as a display panel, and when the mirror display device does not display an image, it functions as a mirror.

SUMMARY

The present disclosure provides a mirror display device with improved display quality.

Embodiments of the inventive concept provide a mirror display device including a first base substrate, a light emitting layer, and a mirror layer. The light emitting layer is provided on the first base substrate. A mirror layer is provided on the light emitting layer and reflects a shape of an object. The light emitting layer may have a circular shape in a plan view.

In an embodiment, a distance between the light emitting layer and the mirror layer may be constant in a plan view.

In an embodiment, the mirror display device may further include a pixel defining layer provided on the first base substrate. The light emitting layer may be provided on the first base substrate and the pixel defining layer. The mirror layer may overlap a portion of the light emitting layer.

In an embodiment, the mirror layer may include an overlapping mirror layer portion that overlaps the pixel defining layer; and a non-overlapping mirror layer portion that does not overlap the pixel defining layer.

In an embodiment, the non-overlapping mirror layer portion may overlap the light emitting layer.

In an embodiment, the non-overlapping mirror layer portion may have a ring shape in a plan view.

In an embodiment, the light emitting layer may include an overlapping light emitting layer portion that overlaps the mirror layer; and a non-overlapping light emitting layer portion that does not overlap the mirror layer.

In an embodiment, in a plan view, the non-overlapping light emitting layer portion may have a circular shape, and the overlapping light emitting layer portion may have a ring shape.

In an embodiment, in a plan view, the width of the overlapping light emitting layer portion may be constant.

In an embodiment, the mirror display device may further include a plurality of pixels. Each of the pixels may include a pixel light emitting layer having a circular shape and the mirror layer may include a pixel mirror layer provided on the pixel light emitting layer.

In an embodiment, the pixel light emitting layer may include an overlapping pixel light emitting layer portion that overlaps the pixel mirror layer; and a non-overlapping pixel light emitting layer portion that does not overlap the pixel mirror layer.

In an embodiment, in a plan view, the non-overlapping pixel light emitting layer portion may have a circular shape, and the overlapping pixel light emitting layer portion may have a ring shape.

In an embodiment, in a plan view, the width of the overlapping pixel light emitting layer portion may be constant.

Embodiments of the inventive concept provide a mirror display device including an image area configured to display the image; and a mirror area configured to reflect a shape of an object. The image area may have a circular shape in a plan view.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION OF THE EMBODIMENTS

Figure 1A:
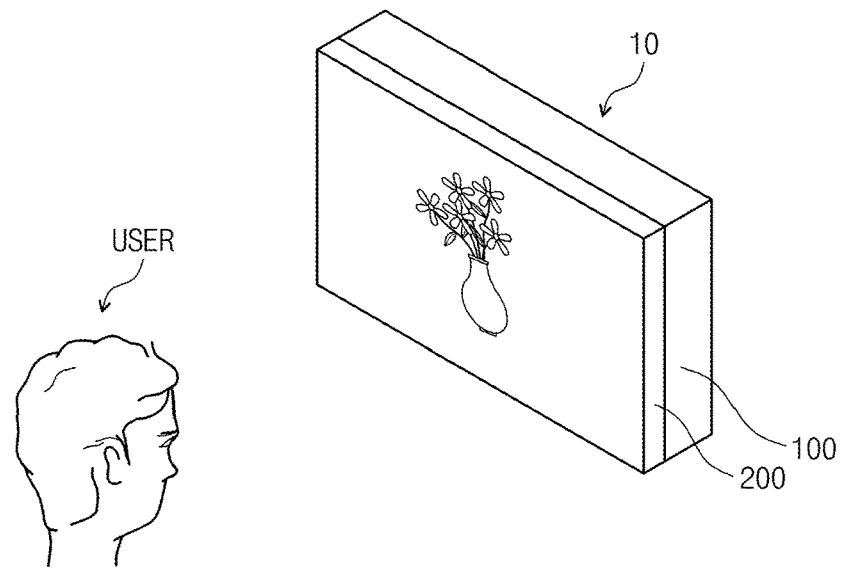
FIG. 1A is a schematic perspective view illustrating that a mirror display device according to an embodiment of the inventive concept receives an image signal to display an image.

The objects, other objectives, features, and advantages of the inventive concept are exemplified by the embodiments described below and illustrated in the accompanying drawings. The inventive concept may, however, be embodied in different forms and should not be construed as limited to the embodiments set forth herein. Rather, these embodiments are provided to help convey the scope of the inventive concept to those skilled in the art.

Like reference numerals refer to like elements throughout. In the drawings, the dimensions and size of each structure may be exaggerated, omitted, or schematically illustrated for convenience in description and clarity. In the specification, the meaning of 'include' or 'comprise' specifies a property, a numeral, a step, an operation, an element or a combination thereof, but does not exclude other properties, numerals, steps, operations, elements or combinations thereof. In addition, when a layer, a film, a region, or a plate is referred to as being 'on' another layer, region, film, or plate, it may be directly on the other layer, film, region, or plate, or intervening layers, films, regions, or plates may also be present. Likewise, when a layer, a film, a region, or a plate is referred to as being 'under' another layer, region, or plate, it may be directly under the other layer, film, region, or plate, or intervening layers, films, regions, or plates may also be present.

Hereinafter, a mirror display device according to an embodiment of the inventive concept is described.

FIG. 1A is a schematic perspective view illustrating that a mirror display device according to an embodiment of the inventive concept receives an image signal to display an image.

Figure 1B:
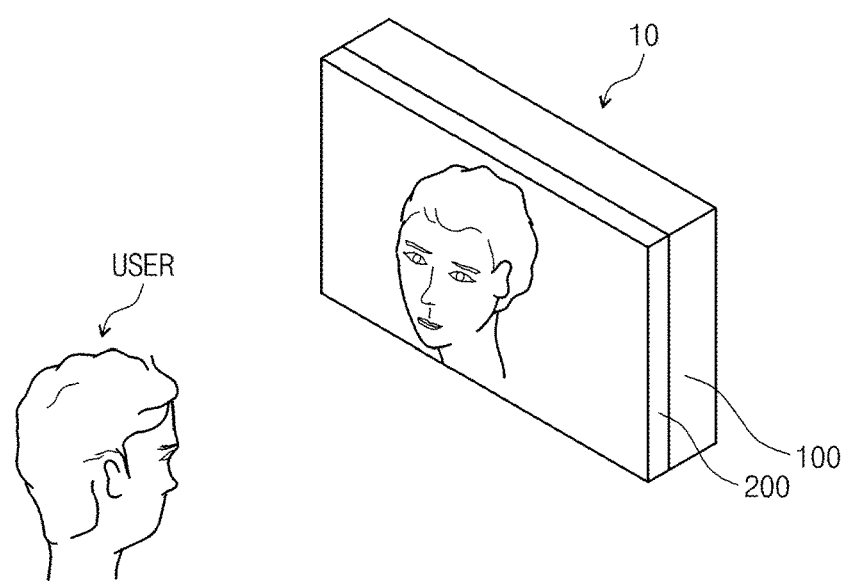
FIG. 1B is a schematic perspective view illustrating that a mirror display device according to an embodiment of the inventive concept reflects a shape of an object.

FIG. 1B is a schematic perspective view illustrating that a mirror display device according to an embodiment of the inventive concept reflects a shape of an object.

Referring to FIGS. 1A and 1B, a mirror display device according to an embodiment of the inventive concept includes an image display part 100 and a mirror part 200. The image display part 100 receives an image signal to display an image. The mirror part 200 is provided on the image display part 100. The mirror part 200 reflects the shape of an object. Kinds of objects are not particularly limited, and may include a user USER, a subject, etc.

The mirror display may be operated by receiving an electric field to be driven. The mirror display device 10 may display an image by receiving an electric field. Accordingly, as illustrated in FIG. 1A, a user USER may recognize an image displayed on the mirror display device 10.

The mirror display device 10 may function as a mirror. For example, the mirror display device 10 may function as a mirror when an electric field is not applied thereto. As illustrated in FIG. 1B, a user USER may view the shape of the user USER reflected on the mirror display device 10.

Figure 2:
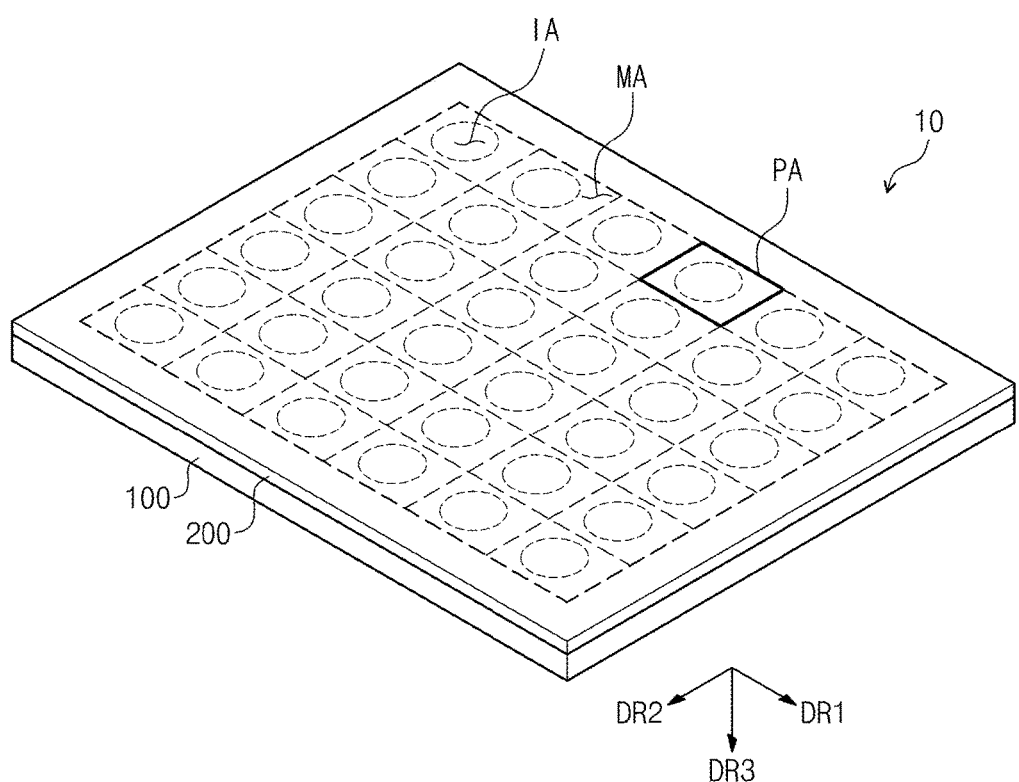
FIG. 2 is a schematic view illustrating a mirror display device according to an embodiment of the inventive concept.

FIG. 2 is a schematic view illustrating a mirror display device according to an embodiment of the inventive concept.

Referring to FIG. 2, a mirror display 10 apparatus according to an embodiment of the inventive concept includes an image area IA and a mirror area MA.

The image area IA receives an image signal to display an image. When viewed from a thickness direction DR3 of the mirror display device 10, the image area IA may have an approximately circular shape.

The image area IA may be included in a plurality of pixel areas PA. The pixel areas PA may be disposed in a matrix shape. For example, the pixel areas PA may be defined by gate lines (GL of FIG. 3), data lines (DL of FIG. 3), and driving voltage lines (DVL of FIG. 3). The pixel areas PA may respectively include a plurality of pixels (PX of FIG. 3). In the mirror display device 10 according to an embodiment of the inventive concept, it is illustrated that the pixel areas PA have rectangular shapes as an example, but embodiments of the inventive concept are not limited thereto. For example, the pixel areas PA may have circular shapes.

The mirror area MA serves as a mirror. When viewed from the thickness direction DR3 of the mirror display device 10, the mirror area MA may surround, for example, the image area IA. When viewed from the thickness direction DR3 of the mirror display device 10, the mirror area MA may have a rectangular shape in which a plurality of circular shapes are omitted.

Figure 3:
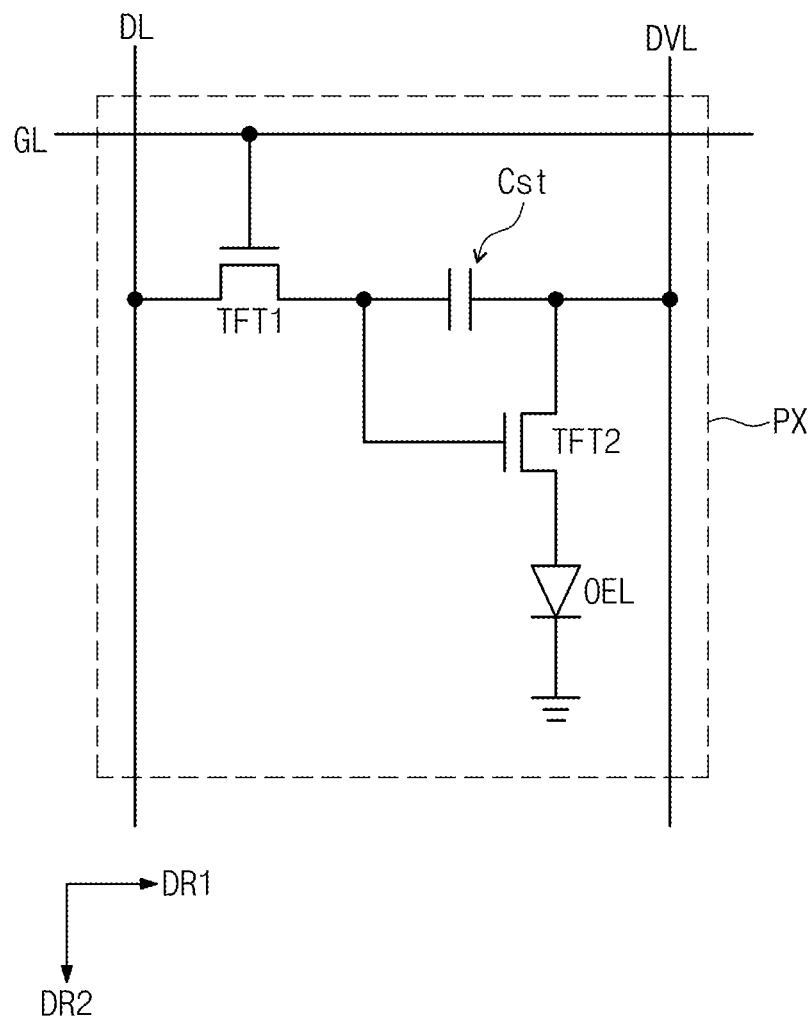
FIG. 3 is a circuit diagram of one of the pixels included in a mirror display device according to an embodiment of the inventive concept.

FIG. 3 is a circuit diagram of one of the pixels included in a mirror display device according to an embodiment of the inventive concept.

Figure 4:
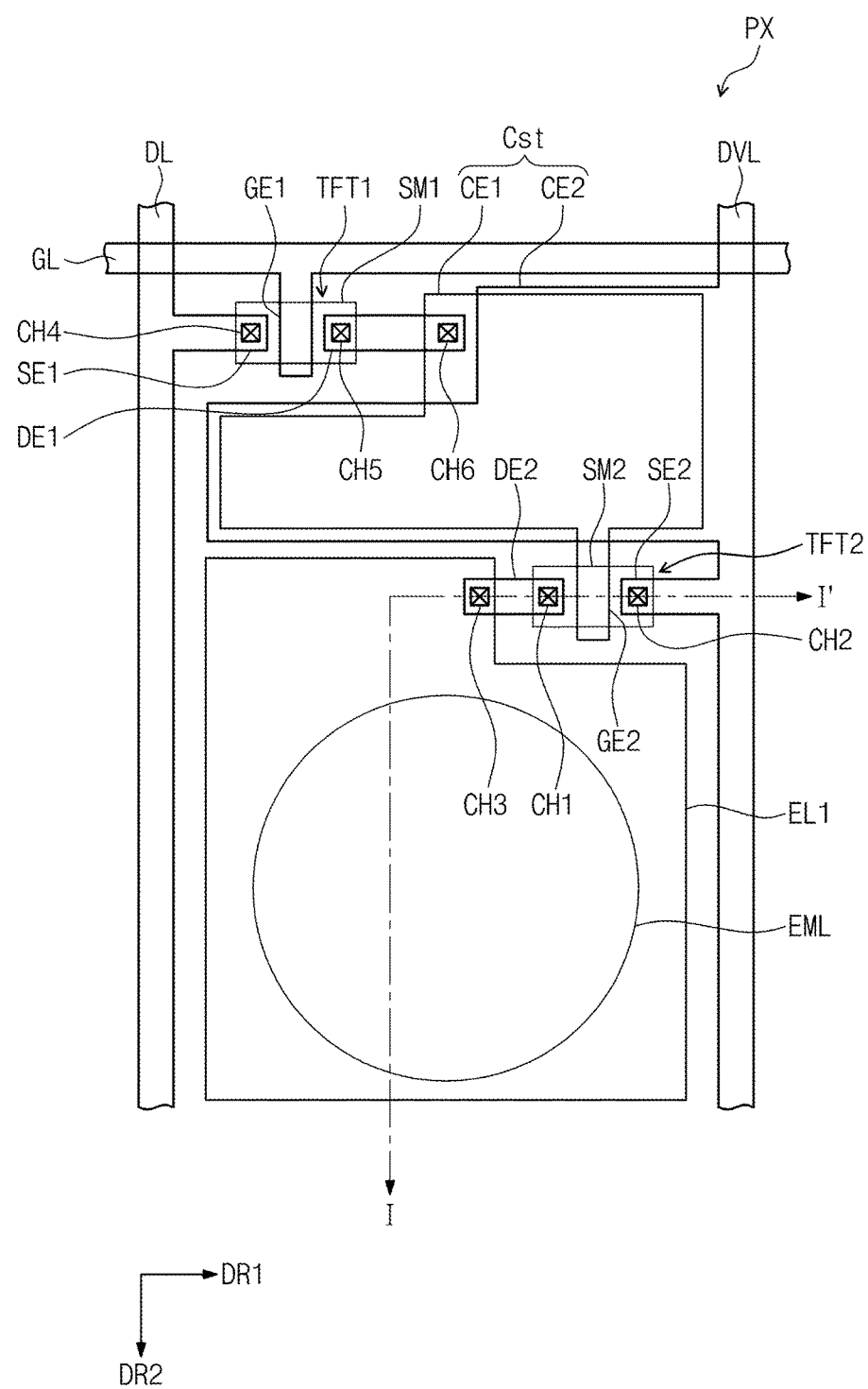
FIG. 4 is a plan view illustrating one of the pixels included in a mirror display device according to an embodiment of the inventive concept.

FIG. 4 is a plan view illustrating one of the pixels included in a mirror display device according to an embodiment of the inventive concept.

Figure 5:
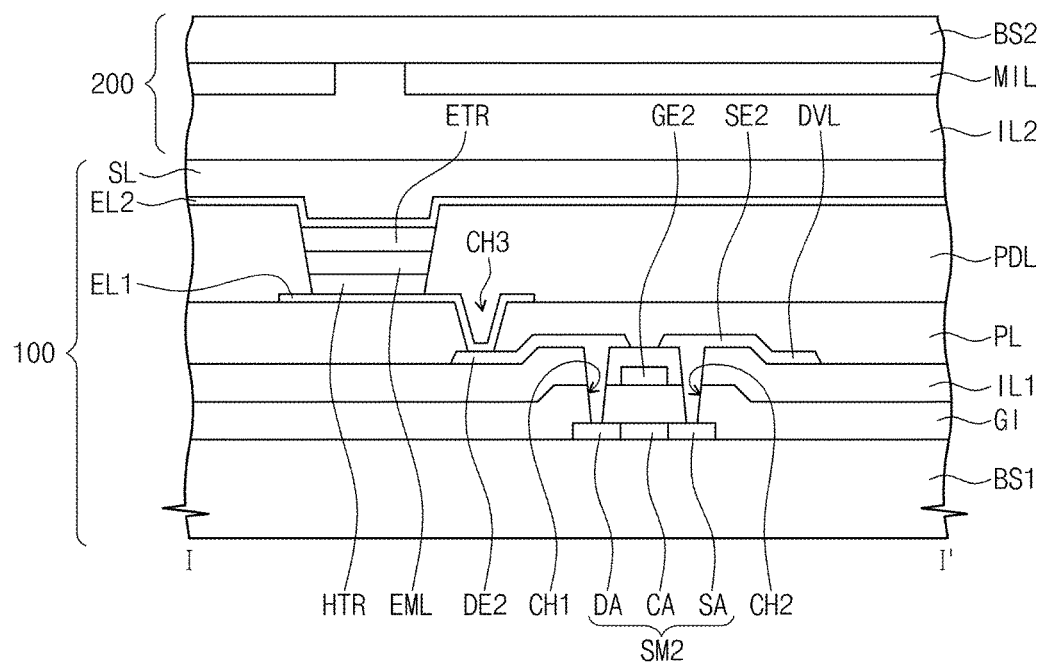
FIG. 5 is a schematic cross-sectional view taken along line I-I' of FIG. 4.

FIG. 5 is a schematic cross-sectional view taken along line I-I' of FIG. 4.

Referring to FIGS. 1A, 1B, and 3 to 5, each of the pixels PX may be connected to a wiring part including gate lines GL, data lines DL, and driving voltage lines DVL. Each of the pixels PX includes thin film transistors TFT1 and TFT2 connected to the wiring part, an organic light emitting element OEL connected to the thin film transistors TFT1 and TFT2, and a capacitor Cst.

In an embodiment of the inventive concept, it is illustrated that one pixel is connected to one gate line, one data line and one driving voltage line as an example, but embodiments of the inventive concept are not limited thereto. For example, a plurality of pixels PX may be connected to one gate line, one data line and one driving voltage line. Also, one pixel may be connected to one or more gate lines, one or more data lines, and one or more driving voltage lines.

Also, in the mirror display device 10 according to an embodiment of the inventive concept, it is illustrated that the pixels PX have rectangular shapes as an example, but embodiments of the inventive concept are not limited thereto. For example, the pixel areas PA may have circular shapes.

The gate lines GL extend in a first direction DR1. The data lines DL extend in a second direction DR2 crossing the gate lines GL. The driving voltage lines DVL extend in a direction substantially the same as that of the data lines DL, that is, in the second direction DR2. The gate lines GL transfer scanning signals to the thin film transistors TFT1 and TFT2, the data lines DL transfer data signals to the thin film transistors TFT1 and TFT2, and the driving voltage lines DVL provide the thin film transistors TFT1 and TFT2 with a driving voltage.

Each of the pixels PX may emit light with a specific color, for example, one from among red, green, and blue lights. Kinds of color lights are not limited thereto. For example, white, cyan, magenta, yellow lights, or the like may be further included.

The thin film transistors TFT1 and TFT2 may include a driving thin film transistor TFT2 for controlling the organic light emitting element OEL, and a switching thin film transistor TFT1 for switching the driving thin film transistor TFT2. In an embodiment of the inventive concept, it is illustrated that each of the pixels PX has two thin film transistors TFT1 and TFT2, but embodiments of the inventive concept are not limited thereto. For example, each of the pixels PX may have include a thin film transistor and a capacitor, and each of the pixels PX may include three or more thin film transistors and two or more capacitors.

The switching thin film transistor TFT1 includes a first gate electrode GE1, a first source electrode SE1, and a first drain electrode DE1. The first gate electrode GE1 is connected to the gate lines GL, and the first source electrode SE1 is connected to the data lines DL. The first drain electrode DE1 is connected to the first common electrode CE1 through a fifth contact hole CH5. The switching thin film transistor TFT1 transfers data signals, which are applied to the data lines DL according to scanning signals applied to the gate lines GL, to the driving thin film transistor TFT2.

The driving thin film transistor TFT2 includes a second gate electrode GE2, a second source electrode SE2, and a second drain electrode DE2. The second gate electrode GE2 is connected to the first common electrode CE1. The second source electrode SE2 is connected to the driving voltage lines DVL. The second drain electrode DE2 is connected to the first electrode EL1 through a third contact hole CH3.

The first electrode EL1 is connected to the second drain electrode DE2 of the driving thin film transistor TFT2. A common voltage is applied to the second electrode EL2, and the light emitting layer EML emits blue light according to an output signal of the driving thin film transistor TFT2, thereby displaying an image. The first and second electrodes EL1 and EL2 are described below in more detail.

The capacitor Cst is connected between the second gate electrode GE2 of the driving thin film transistor TFT2 and the second source electrode SE2 of the driving thin film transistor TFT2, and charges and maintains the data signal inputted to the second gate electrode GE2 of the driving thin film transistor TFT2. The capacitor Cst may include a first common electrode CE1 connected to the first drain electrode DE1 through a sixth contact hole CH6 and a second common electrode CE2 electrically connected to the first common electrode CE1 and the driving voltage lines DVL.

Referring to FIGS. 1A, 1B, 4A, and 5, as described above, the mirror display device 10 according to an embodiment of the inventive concept includes an image display part 100 and a mirror part 200. The image display part 100 includes a first base substrate BS1, thin film transistors TFT1 and TFT2 provided on the first base substrate BS1, and the organic light emitting element OEL.

Materials for the first base substrate BS1 are not particularly limited thereto as long as being generally used. For example, the base substrate BS1 may be formed of insulating materials such as glass, plastic, and quartz. Organic polymers forming the first base substrate BS1 include polyethylene terephthalate (PET), polyethylene naphthalate (PEN), polyimide, polyether sulfone, etc. The first base substrate BS1 may be selected in consideration of mechanical strength, thermal stability, transparency, surface smoothness, ease of handling, waterproofing property, etc. The first base substrate BS1 may be transparent. The first base substrate BS1 may be flexible or rigid.

A substrate buffer layer (not shown) may be provided on the first base substrate BS1. The substrate buffer layer (not shown) prevents impurities from being diffused to the switching thin film transistor TFT1 and the driving thin film transistor TFT2. The substrate buffer layer (not shown) may be formed of silicon nitride (SiNx), silicon oxide (SiOx), silicon oxynitride (SiOxNy), etc., and may be omitted according to the materials and process conditions used for the first base substrate BS1.

A first and second semiconductor layers SM1 and SM2 are provided on the base substrate BS1. The first and second semiconductor layers SM1 and SM2 are formed of semiconductor materials, and respectively act as the switching thin film transistor TFT1 and the driving thin film transistor TFT2. Each of the first and second semiconductor layers SM1 and SM2 includes a source area SA, a drain area DA, and a channel area CA provided between the source area SA and the drain area DA. Each of the first and second semiconductor layers SM1 and SM2 may be selected from an inorganic semiconductor or an organic semiconductor. The source area SA and the drain area DA may be doped with n-type impurities or p-type impurities.

A gate insulation layer GI is provided on the first and second semiconductor layers SM1 and SM2. The gate insulation layer GI covers the first and second semiconductor layers SM1 and SM2. The gate insulation layer GI may be formed of organic or inorganic insulating materials.

The first and second gate electrodes GE1 and GE2 are provided on the gate insulation layer GI. The first and second gate electrodes GE1 and GE2 are respectively provided to cover regions corresponding to the channel areas CA of the first and second semiconductor layers SM1 and SM2.

A first insulation layer IL1 is provided on the first and second gate electrodes GE1 and GE2. The first insulation layer IL1 covers the first and second gate electrodes GE1 and GE2. The gate insulation layer GI may be formed of organic or inorganic insulating materials.

The first source electrode SE1, the first drain electrode DE1, the second source electrode SE2, and the second drain electrode DE2 are provided on the first insulation layer IL1. The second drain electrode DE2 contacts the drain area DA of the second semiconductor layer SM2 through a first contact hole CH1 formed in the gate insulation layer GI and the first insulation layer ILL and the second source electrode SE2 contacts the source area SA of the second semiconductor layer SM2 through a second contact hole CH2 formed in the gate insulation layer GI and the first insulation layer IL1. The first source electrode SE1 contacts the source area (not shown) of the first semiconductor layer SM1 through a fourth contact hole CH4 formed in the gate insulation layer GI and the first insulation layer ILL and the first drain electrode DE1 contacts the drain area (not shown) of the first semiconductor layer SM1 through a fifth contact hole CH5 formed in the gate insulation layer GI and the first insulation layer ILL A passivation layer PL is provided on the first source electrode SE1, the first drain electrode DE1, on the second source electrode SE2, and the second drain electrode DE2. The passivation layer PL may function as a protective film that protects the switching thin film transistor TFT1 and the driving thin film transistor TFT2, and also function as a planarization film that planarizes the overlying surface of the switching thin film transistor TFT1 and the driving thin film transistor TFT2.

A first electrode EL1 is provided on the passivation layer PL. The first electrode EL1 may be, for example, an anode. The first electrode EL1 is connected to the second drain electrode DE2 of the driving thin film transistor TFT2 through a third contact hole CH3 formed in the passivation layer PL.

A pixel defining layer PDL that separates the light emitting layer EML into a plurality of units to correspond to each of the pixels PX is provided on the passivation layer PL. The pixel defining layer PDL exposes an upper surface of the first electrode EL1 and protrudes from the first base substrate BS1. The pixel defining layer PDL may include a metal-fluorine ion compound. For example, the pixel defining layer PDL may be formed of any one metal-fluorine ion compound selected from LiF, BaF2, and CsF. The metal-fluorine ion compound has an insulating property when having a predetermined thickness. The thickness of the pixel defining layer PDL may be, for example, from about 10 nm to about 100 nm. The pixel defining layer PDL is described below in more detail.

The organic light emitting element OEL is provided in a region surrounded by the pixel defining layer PDL. The organic light emitting element OEL includes the first electrode EL1 a hole transport region HTR, a light emitting layer EML, an electron transport region ETR, and the second electrode EL2.

The first electrode EL1 has conductivity. The first electrode EL1 may be a pixel electrode or an anode. The first electrode EL1 may be a transmissive electrode, a transreflective electrode, or a reflective electrode. When the first electrode EL1 is a transmissive electrode, the first electrode EL1 may be formed of transparent metal oxides, such as indium tin oxide (ITO), indium zinc oxide (IZO), and indium tin zinc oxide (ITZO). When the first electrode EL1 is a transreflective or a reflective electrode, the first electrode EL1 may include Ag, Mg, Al, Pt, Pd, Au, Ni, Nd, Ir, Cr or a mixture of metal.

An organic layer is disposed on the first electrode EL1. The organic layer includes the light emitting layer EML. The organic layer may further include the hole transport region HTR and the electron transport region ETR.

The hole transport region HTR is provided on the first electrode EL1. The hole transport region HTR may include at least one of a hole injection layer, a hole transport layer, a buffer layer, or an electron blocking layer.

The hole transport region HTR may have a single layer formed of a single material, a single layer formed of materials different from each other, or a multilayer having a plurality of layers formed of a plurality of materials different from each other.

For example, the hole transport region HTR may have a single layer structure formed of a plurality of materials different from each other, or structures of hole injection layer/hole transport layer, hole injection layer/hole transport layer/buffer layer, hole injection layer/buffer layer/hole transport layer/buffer layer, or hole injection layer/hole transport layer/electron blocking layer, as sequentially stacked from the first electrode EL1. However, embodiments of the inventive concept are not limited thereto.

The hole transport region HTR may be formed through various methods, such as a vacuum deposition method, a spin coating method, a casting method, a Langmuir-Blodgettt (LB) method, an inkjet printing method, a laser printing method, and a laser induced thermal imaging (LITI) method.

When the hole transport region HTR includes a hole injection layer, the hole transport region HTR may include a phthlocyamine compound such as copper phthlocyamine; [4-(phenyl-m-tolyl-amino)-phenyl]-biphenyl-4,4'-diamine (DNTPD), 4,4',4"-tris(3-methylphenylphenylamino) triphenylamine (m-MTDATA), 4,4'4"-Tris(N,N-diphenylamino) triphenylamine (TDATA), 4,4',4"-tris{N,-(2-naphthyl)-N-phenylamino}-triphenylamine (2NATA), Poly(3,4-ethylenedioxythiophene)/Poly(4-styrenesulfonate) (PEDOT/PSS), Polyaniline/Dodecylbenzenesulfonic acid (PANI/DBSA), Polyaniline/Camphor sulfonicacid (PANI/CSA), and (Polyaniline)/Poly(4-styrenesulfonate) (PANI/PSS), etc., but embodiments of the inventive concept are not limited thereto.

When the hole transport region HTR includes a hole transport layer, the hole transport region HTR may include a carbazole based derivative such as N-phenyl carbazole, polyvinyl carbazole, a fluorine based derivative, a triphenylamine based derivative such as N,N'-bis(3-methylphenyl)-N,N-diphenyl-[1,1-biphenyl]-4,4'-diamine (TPD), 4,4',4"-tris(N-carbazolyl)triphenylamine (TCTA), N,N'-di(1-naphthyl)-N,N-diphenylbenzidine (NPB), 4,4'-Cyclohexylidene bis[N,N-bis(4-methylphenyl) benzenamine] (TAPC), etc., but embodiments of the inventive concept are not limited thereto.

The hole transport region HTR may further include electric charge generation materials to improve conductivity, besides the above-mentioned materials. The electric charge generation materials may be uniformly or non-uniformly dispersed inside the hole transport region HTR. The electric charge generation materials may be p-dopant. The p-dopant may be, although not limited to, quinine derivatives, metal oxides, or cyano group-containing compounds. For example, non-limiting examples of the p-dopant may include quinone derivatives such as tetracyanoquinodimethane (TCNQ) and 2,3,5,6-tetrafluoro-tetracyanoquinodimethane (F4-TCNQ), and metal oxides such as tungsten oxides and molybdenum oxides, but embodiments of the inventive concept are not limited thereto.

The light emitting layer EML is provided on the hole transport region HTR. The light emitting layer EML may have a single layer formed of a single material, a single layer formed of materials different from each other, or a multilayer having a plurality of layers formed of a plurality of materials different from each other.

Materials for the light emitting layer EML are not particularly limited as long as being generally used. The light emitting layer EML may be formed of, for example, materials emitting red, green, or blue colors, and include fluorescent materials or phosphorescent materials. Also, the light emitting layer EML may include a host and a dopant.

Materials for the host are not particularly limited as long as being generally used. The host may use, for example, tris(8-hydroxyquinolino)aluminum (Alq3), 4,4'-bis(N-carbazolyl)-1,1'-biphenyl), PVK (poly(n-vinylcarbazole) (CBP), 9,10-di(naphthalene-2-yl)anthracene (AND), 4,4', 4"-Tris(carbazol-9-yl)-triphenylamine (TCTA), 1,3,5-tris (N-phenylbenzimidazole-2-yl)benzene (TPBi), 3-tert-butyl-9,10-di(naphth-2-yl)anthracene), DSA (distyrylarylene (TBADN), 4,4'-bis(9-carbazolyl)-2,2'-dimethyl-biphenyl (CDBP), 2-Methyl-9,10-bis(naphthalen-2-yl)anthracene (MADN), etc.

When the light emitting layer EML emits a red light, the light emitting layer EML may include, for example, fluorescent material, such as including tris(dibenzoylmethanato) phenanthoroline europium (PBD:Eu(DBM)3(Phen)) or perylene. When the light emitting layer EML emits a red light, the dopant included in the light emitting layer EML may be selected from metal complexes or organometallic complexes such as bis(1-phenylisoquinoline)acetylacetonate iridium) (PIQIr(acac)), bis(1-phenylquinoline)acetylacetonate iridium (PQIr(acac)), tris(1-phenylquinoline)iridium (PQIr) or octaethylporphyrin platinum (PtOEP).

When the light emitting layer EML emits a green light, the light emitting layer EML may include, for example, fluorescent materials including tris(8-hydroxyquinolino)aluminum (Alq3). When the light emitting layer EML emits a green light, the dopant included in the light emitting layer EML may be selected from metal complexes or organometallic complexes such as fac-tris(2-phenylpyridine)iridium (Ir(ppy)3).

When the light emitting layer EML emits a blue light, the light emitting layer EML may include, for example, fluorescent materials including any one selected from the group consisting of spiro-DPVBi, spiro-6P, distyryl-benzene (DSB), distyryl-arylene (DSA), and Polyfluorene (PFO)

based polymers and poly(p-phenylene vinylene) (PPV) based polymers. When the light emitting layer EML emits a blue light, the dopant included in the light emitting layer EML may be selected from metal complexes or organometallic complexes such as (4,6-F2ppy)2Irpic. The light emitting layer EML is described below in more detail.

The electron transport region ETR is provided on the light emitting layer EML. The electron transport region ETR may include at least one of the hole blocking layer, the electron transport layer, or the electron injection layer, but embodiments of the inventive concept are not limited thereto.

When the electron transport region ETR includes an electron transport layer, electron transport region ETR may include Tris(8-hydroxyquinolinato)aluminum), TPBi(1,3,5-Tri(1-phenyl-1H-benzo[d]imidazol-2-yl)phenyl (Alq3), 2,9-Dimethyl-4,7-diphenyl-1,10-phenanthroline (BCP), 4,7-Diphenyl-1,10-phenanthroline), TAZ(3-(4-Biphenylyl)-4-phenyl-5-tert-butylphenyl-1,2,4-triazole (Bphen), 4-(Naphthalen-1-yl)-3,5-diphenyl-4H-1,2,4-triazole (NTAZ), 2-(4-Biphenylyl)-5-(4-tert-butylphenyl)-1,3,4-oxadiazole (tBu-PBD), Bis(2-methyl-8-quinolinolato-N1,O8)-(1,1'-Biphenyl-4-olato)aluminum (BAlq), berylliumbis(benzoquinolin-10-olate) (Bebq2), 9,10-di(naphthalene-2-yl) anthracene (AND) and mixtures thereof, but embodiments of the inventive concept are not limited thereto. The thickness of electron transport layer may be from about 100 Å to about 1000 Å, for example, from about 150 Å to about 500 Å. When the thickness of the electron transport layer falls within the above-mentioned range, a satisfactory degree of electron transport characteristic may be obtained without a substantial increase in driving voltage.

When the electron transport region includes an electron injection layer, lanthanum group metals such as LiF, lithium quinolate (LiQ), $Li_2O$, BaO, NaCl, CsF, and Yb, or metal halides such as RbCl, and RbI may be used for the electron transport region, but embodiments of the inventive concept are not limited thereto. The electron injection layer may also be formed of materials in which an electron transport material and an organo metal salt are mixed. The organo metal salt may be a material that has an energy band gap of about 4 eV or more. For example, the organo metal salt may specifically include metal acetate, metal benzodate, metal acetoacetate, metal acetylacetonate or metal stearate. The thickness of the electron injection layer may be from about 1 Å to about 100 Å, for example, from about 3 Å to about 90 Å. When the thickness of the electron injection layer falls within the above-mentioned range, a satisfactory degree of electron injection characteristic may be obtained without a substantial increase in driving voltage.

The electron transport region, as described above, may include a hole blocking layer. The hole blocking layer, for example, may include at least one of 2,9-dimethyl-4,7-diphenyl-1,10-phenanthroline (BCP) or 4,7-diphenyl-1,10-phenanthroline (Bphen), but embodiments of the inventive concept are not limited thereto.

The second electrode EL2 is provided on the electron transport region ETR. The second electrode CE may be a common electrode or a cathode. The second electrode EL2 may be a transmissive electrode, a transflective, or a reflective electrode.

When the second electrode EL2 is a transmissive electrode, the second electrode EL2 may include Li, Ca, LiF/Ca, LiF/Al, Al, Mg, BaF, Ba, Ag, or a compound thereof or a mixture thereof (for example, a mixture of Ag and Mg).

The second electrode EL2 may include an auxiliary electrode. The auxiliary electrode may include a film that is obtained by depositing the above-mentioned materials to face the light emitting layer EML, and transparent metal oxides, such as, indium tin oxide (ITO), indium zinc oxide (IZO), zinc oxide (ZnO), indium tin zinc oxide (ITZO), etc. Also, the auxiliary electrode may include, Mo, Ti, etc.

When the second electrode EL2 is a transmissive or reflective electrode, the second electrode EL2 may include Ag, Mg, Al, Pt, Pd, Au, Ni, Nd, Ir, Cr, Li, Ca, LiF/Ca, LiF/Al, Mo, Ti, or a compound thereof or a mixture thereof (for example, a mixture of Ag and Mg). Alternatively, the second electrode EL2 may be a multi-layered structure including a reflective film or transflective film formed of the above-mentioned materials and a transparent conductive film formed of indium tin oxide (ITO), zinc oxide (ZnO), indium tin zinc oxide (ITZO), etc.

When the organic light emitting element is a top emission type, the first electrode EL1 is a reflective electrode, and the second electrode EL2 is a transmissive electrode or a transflective electrode. When the organic light emitting element is a bottom emission type, the first electrode EL1 is a transmissive electrode or a transflective electrode, and the second electrode EL2 is a reflective electrode.

In the organic light emitting element, as a voltage is applied to each of the first and second electrodes EL1 and EL2, holes injected from the first electrode EL1 are moved to the light emitting layer EML through the hole transport region HTR, and electrons injected from the second electrode EL2 are moved to the light emitting layer EML through the electron transport region ETR. The electrons and holes are recombined at the light emitting layer EML to generate excitons, and light is emitted as the excitons return to the ground states.

Although not shown, an organic capping layer may be provided on the second electrode EL2. The organic capping layer may reflect the light emitted from the light emitting layer EML toward the light emitting layer at an upper surface on the organic capping layer. The reflected light is amplified inside the organic layer through a resonant effect, thereby improving the light efficiency of the mirror display device 10. In a top emission type organic light emitting element, the organic capping layer may prevent light loss through the total reflection of light in the second electrode EL2.

A sealing layer SL is provided on the second electrode EL2. The sealing layer SL covers the second electrode EL2. The sealing layer SL may include at least one of organic or inorganic layers. The sealing layer SL protects the organic light emitting element OEL.

The mirror part 200 is provided on the image display part 100. The mirror part 200 includes a mirror layer MIL. The mirror part 200 may further include a second base substrate BS2.

Materials for the second base substrate BS2 are not particularly limited as long as being generally used, but the second base substrate BS2 may be formed of insulating materials such as glass, plastic, and quartz. Organic polymers forming the second base substrate BS2 may include polyethylene terephthalate (PET), polyethylene naphthalate (PEN), polyimide, polyether sulfone, etc. The second base substrate BS2 may be selected in consideration of mechanical strength, thermal stability, transparency, surface smoothness, ease of handling, waterproofing property, etc. The second base substrate BS2 may be transparent. The second base substrate BS2 may be flexible or rigid. In the mirror display device 10 according to an embodiment of the incentive concept, it is exemplarily illustrated that the second base substrate BS2 is included as an example, but embodiments of the inventive concept are not limited thereto. In some cases, the second base substrate BS2 may be omitted.

The mirror layer MIL is provided on the light emitting layer EML. The mirror layer MIL transmits at least a portion of the light received from the image display part 100. The mirror layer MIL reflects at least a portion of the light received from the outside. The mirror layer MIL may include a plurality of holes.

Although not shown, the mirror layer MIL may include a base layer and a metallic layer provided on the base layer. The base layer may include, although not particularly limited as long as being generally used, polyethylene terephthalate (PET), polyethylene naphthalate (PEN), polyimide, polyether sulfone, etc. The metallic layer may include, although not particularly limited as long as being generally used, at least one of aluminum, copper, silver, or gold. The mirror layer MIL is described below in more detail.

The mirror part 200 may further include a second insulating layer IL2. The second insulating layer IL2 may be provided on the second base substrate BS2 and the mirror layer MIL. The second insulation layer IL2 may be formed of organic or inorganic insulating materials. The second insulating layer IL2 may be transparent. In the mirror display device according to an embodiment of the incentive concept, it is exemplarily illustrated that the mirror part includes the second insulative layer IL2, but embodiments of the inventive concept are not limited thereto. In some cases, the second insulating layer IL2 may be omitted.

Figure 6A:
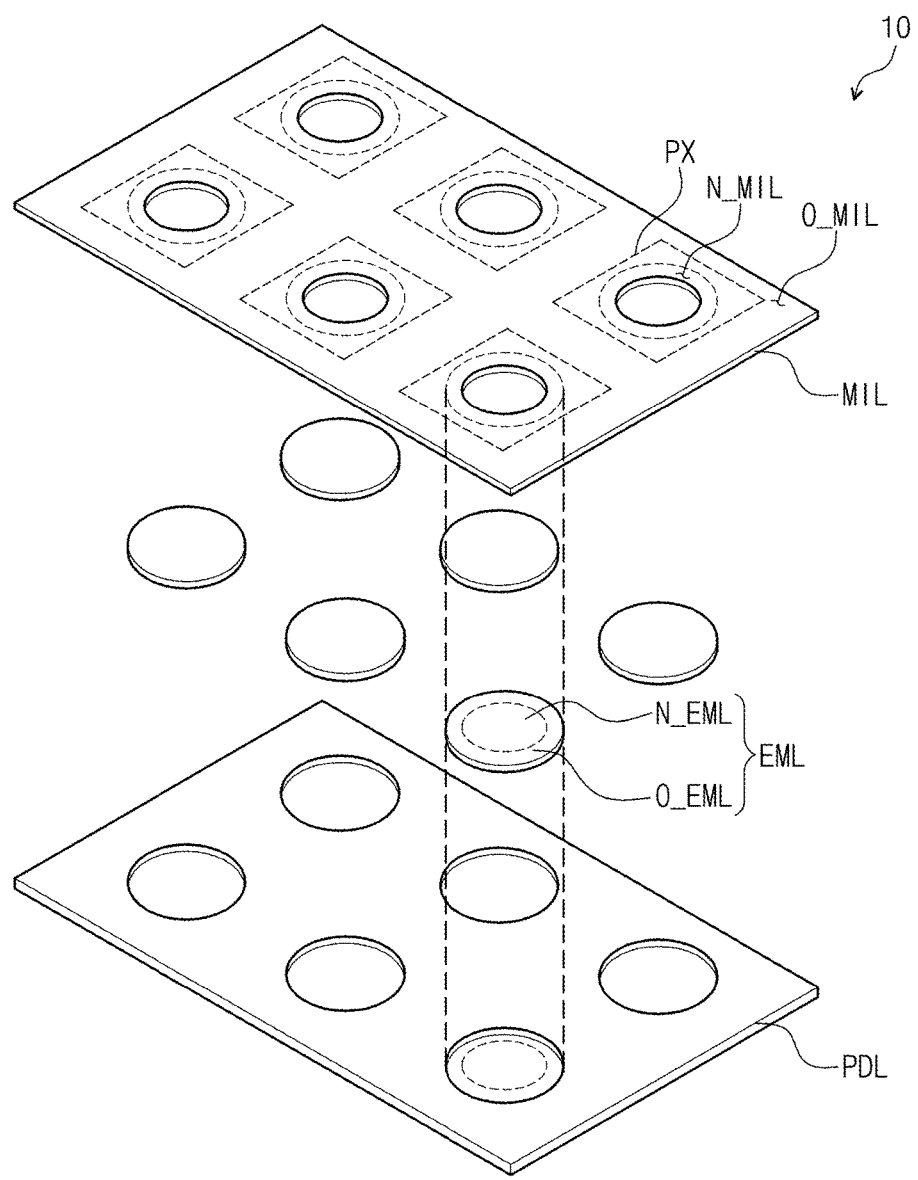
FIG. 6A is a schematic exploded perspective view illustrating a pixel defining layer, a light emitting layer, and a mirror layer, which are included in a mirror display device according to an embodiment of the inventive concept.

FIG. 6A is a schematic exploded perspective view illustrating a pixel defining layer, a light emitting layer, and a mirror layer, which are included in a mirror display device according to an embodiment of the inventive concept.

Figure 6B:
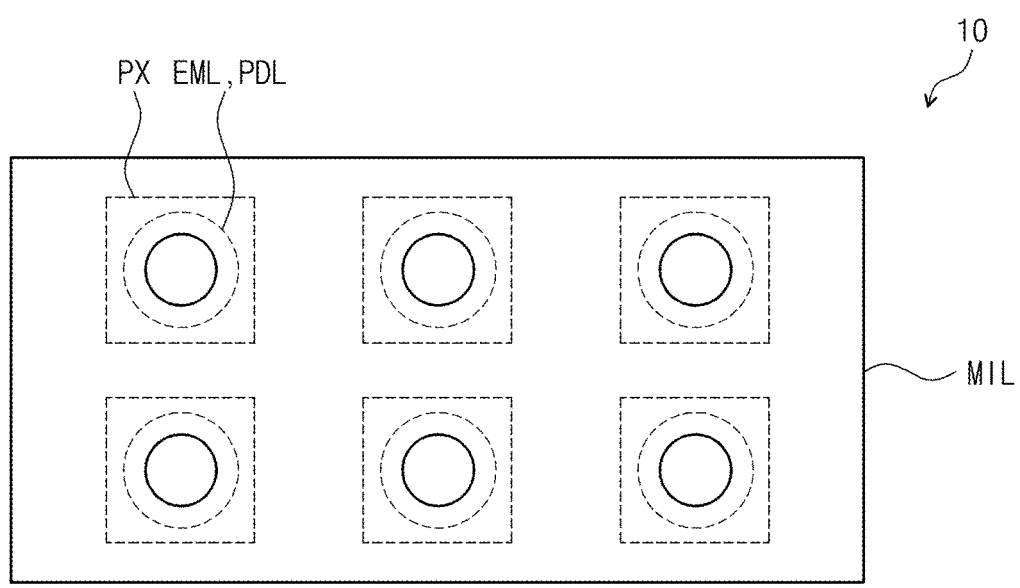
FIG. 6B is a schematic plan view illustrating a pixel defining layer, a light emitting layer, and a mirror layer, which are included in a mirror display device according to an embodiment of the inventive concept.

FIG. 6B is a schematic plan view illustrating a pixel defining layer, a light emitting layer, and a mirror layer, which are included in a mirror display device according to an embodiment of the inventive concept.

Referring to FIGS. 6A and 6B, the light emitting layer EML may have, in a plan view, an approximately circular shape. The term "in a plan view" may mean, for example, when viewed from a thickness direction (e.g., DR3 of FIG. 3). The light emitting layer EML may include an overlapping light emitting layer portion O_EML that overlaps the mirror layer MIL, and a non-overlapping light emitting layer portion N_EML that does not overlap the mirror layer MIL.

In a plan view, the overlapping light emitting layer portion O_EML may approximately have a ring shape. In a plan view, the overlapping light emitting layer portion O_EML may surround the non-overlapping light emitting layer portion N_EML. In a plan view, the width of the overlapping light emitting layer portion O_EML may be constant.

In a plan view, the non-overlapping light emitting layer portion N_EML may have an approximately circular shape. In a plan view, the width of the non-overlapping light emitting layer portion N_EML may be constant.

The mirror layer MIL may overlap a portion of the light emitting layer EML. In a plan view, the distance between the light emitting layer and the mirror layer may be constant.

The mirror layer MIL may include an overlapping mirror layer portion O_MIL that overlaps the pixel defining layer PDL, and a non-overlapping mirror layer portion N_MIL that does not overlap the pixel defining layer PDL.

The overlapping mirror layer portion O_MIL may not overlap the light emitting layer. In a plan view, the overlapping mirror layer portion O_MIL may have a rectangular shape in which a plurality of circular shapes are omitted. In a plan view, the overlapping mirror layer portion O_MIL may surround the non-overlapping mirror layer portion N_MIL.

The non-overlapping mirror layer portion N_MIL overlaps the light emitting layer EML. In a plan view, the non-overlapping mirror layer portion N_MIL may approximately have a ring shape.

Figure 7A:
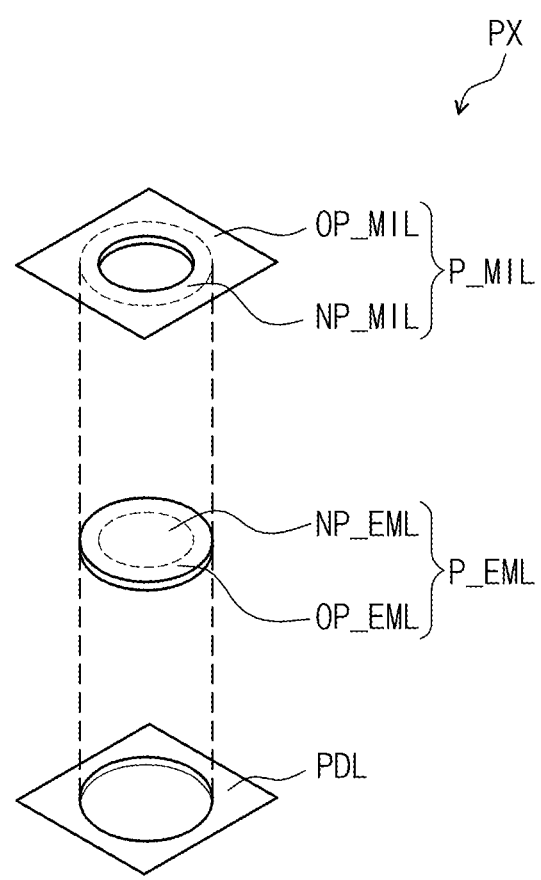
FIG. 7A is a schematic exploded perspective view illustrating a pixel defining layer, a light emitting layer, and a mirror layer, which are included in a pixel from among pixels included in a mirror display device according to an embodiment of the inventive concept.

FIG. 7A is a schematic exploded perspective view illustrating a pixel defining layer, a light emitting layer, and a mirror layer, which are included in a pixel from among pixels included in a mirror display device according to an embodiment of the inventive concept.

Figure 7B:
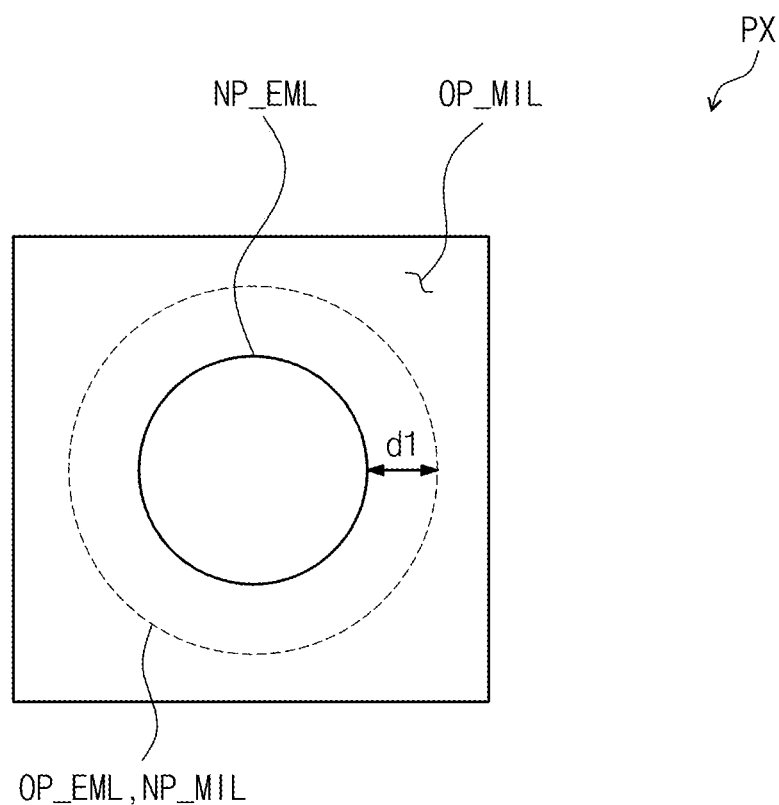
FIG. 7B is a plan view illustrating a pixel defining layer, a light emitting layer, and a mirror layer, which are included in a pixel from among pixels included in a mirror display device according to an embodiment of the inventive concept.

FIG. 7B is a plan view illustrating a pixel defining layer, a light emitting layer, and a mirror layer included in a pixel from among pixels, which are included in a mirror display device according to an embodiment of the inventive concept.

Referring to FIGS. 7A and 7B, as described above, a mirror display device (10 of FIG. 6A) according to an embodiment of the inventive concept may further include a plurality of pixels PX. The light emitting layer (EML of FIG. 6A) includes a pixel light emitting layer P_EML included in each of the pixels PX. The mirror layer (MIL of FIG. 6A) includes a pixel mirror layer P_MIL included in each of the pixels PX. The pixel mirror layer P_MIL is provided on the pixel light emitting layer P_EML.

In a plan view, the pixel light emitting layer P_EML may have an approximately circular shape. The pixel light emitting layer P_EML may include an overlapping pixel light emitting layer portion OP_EML that overlaps the pixel mirror layer P_MIL, and a non-overlapping pixel light emitting layer portion NP_EML that does not overlapping the pixel mirror layer P_MIL.

In a plan view, the overlapping pixel light emitting layer portion OP_EML may approximately have a ring shape. In a plan view, the overlapping pixel light emitting layer portion OP_EML may surround the non-overlapping pixel light emitting layer portion NP_EML. In a plan view, the width of the overlapping pixel light emitting layer portion OP_EML may be constant.

In a plan view, the non-overlapping pixel light emitting layer portion NP_EML may have an approximately circular shape. In a plan view, the width of the non-overlapping pixel light emitting layer portion NP_EML may be constant.

The pixel mirror layer P_MIL may overlap a portion of the pixel light emitting layer P_EML. In a plan view, the distance between the pixel light emitting layer P_EML and the pixel mirror layer P_MIL may be constant. The pixel mirror layer P_MIL may include an overlapping pixel mirror layer portion OP_MIL that overlaps the pixel defining layer PDL, and a non-overlapping pixel mirror layer portion NP_MIL that does not overlap the pixel defining layer PDL.

The overlapping pixel mirror layer portion OP_MIL may not overlap the pixel light emitting layer P_EML. In a plan view, the overlapping pixel mirror layer portion OP_MIL may have a rectangular shape in which a circular shape is omitted. In a plan view, the overlapping pixel light emitting layer portion OP_MIL may surround the non-overlapping pixel mirror layer portion NP_MIL.

The non-overlapping pixel mirror layer portion NP_MIL may overlap the pixel light emitting layer P_EML. In a plan view, the non-overlapping pixel mirror layer portion NP_MIL may have an approximate ring shape.

Typical mirror display devices, in general, include image display parts including non-emissive type display panels such as liquid crystal display panels, plasma display panels, electrophoretic display panels, microelectromechanical system display panels, and electrowetting display panels. Thus, the typical mirror display devices make it difficult to realize a slim mirror display device or a flexible mirror display device.

However, the mirror display device according to an embodiment of the inventive concept includes an image display part that has a self-emissive type organic light emitting element. Thus, a slim mirror display device and a flexible mirror display device may be realized.

Also, since typical mirror display devices generally include a light emitting layer having a rectangular shape in a plan view, it is difficult to ensure a predetermined viewing angle in all directions. However, the mirror display device according to an embodiment of the inventive concept includes a light emitting layer having a circular shape in a plan view, and thus has a predetermined viewing angle in all direction. Consequently, uniformity of image quality may be improved, and thus display quality of the mirror display device may be improved.

The mirror layer of the mirror display device according to an embodiment of the inventive concept includes a non-overlapping mirror layer that does not overlap the pixel defining layer in a plan view but overlaps the light emitting layer. Accordingly, even if a misalignment occurs during the process, a pixel defining layer that does not overlap the mirror layer is not generated. Thus, in a plan view, an entire area of the mirror display device may be subdivided into an image region or a mirror region. Accordingly, the generation of a dark portion that is neither a light emitting region nor a mirror region may be prevented.

According to embodiments of the inventive concept, the mirror display device may have improved display quality.

The above-disclosed subject matter is to be considered illustrative and not restrictive, and the appended claims are intended to cover all such modifications, enhancements, and other embodiments that fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description. Therefore, the above-described embodiments are illustrative in all the aspects, and should be construed as not being limitative.

What is claimed is:

1. A mirror display device comprising:
a first base substrate;
a first electrode provided on the first base substrate;
a second electrode provided on the first electrode;
a light emitting layer provided between the first electrode and the second electrode;
a sealing layer covering the second electrode;
an insulating layer provided on the sealing layer; and
a mirror layer provided on the insulating layer and configured to reflect a shape of an object,
wherein the light emitting layer has a circular shape in a plan view.

2. The mirror display device of claim 1, wherein a distance between the light emitting layer and the mirror layer is constant in a plan view.

3. The mirror display device of claim 1, further comprising a pixel defining layer provided on the first base substrate to expose an upper surface of the first electrode, wherein the light emitting layer is provided on the first base substrate and the pixel defining layer, and the mirror layer overlaps a portion of the light emitting layer.

4. The mirror display device of claim 3, wherein the mirror layer comprises:
an overlapping mirror layer portion that overlaps the pixel defining layer; and
a non-overlapping mirror layer portion that does not overlap the pixel defining layer.

5. The mirror display device of claim 4, wherein the non-overlapping mirror layer portion overlaps the light emitting layer.

6. The mirror display device of claim 4, wherein the non-overlapping mirror layer portion has a ring shape in a plan view.

7. The mirror display device of claim 1, wherein the light emitting layer comprises:
an overlapping light emitting layer portion that overlaps the mirror layer; and
a non-overlapping light emitting layer portion that does not overlap the mirror layer.

8. The mirror display device of claim 7, wherein in a plan view, the non-overlapping light emitting layer portion has a circular shape, and the overlapping light emitting layer portion has a ring shape.

9. The mirror display device of claim 7, wherein in a plan view, a width of the overlapping light emitting layer portion is constant.

10. The mirror display device of claim 1, further comprising a plurality of pixels, wherein each of the pixels includes a pixel light emitting layer having a circular shape, and the mirror layer includes a pixel mirror layer provided on the pixel light emitting layer.

11. The mirror display device of claim 10, wherein the pixel light emitting layer comprises an overlapping pixel light emitting layer portion that overlaps the pixel mirror layer; and a non-overlapping pixel light emitting layer portion that does not overlap the pixel mirror layer.

12. The mirror display device of claim 11, wherein in a plan view, the non-overlapping pixel light emitting layer portion has a circular shape, and the overlapping pixel light emitting layer portion has a ring shape.

13. The mirror display device of claim 12, wherein in a plan view, a width of the overlapping pixel light emitting layer portion is constant.

14. A mirror display device comprising:
an image display part configured to display an image by receiving an image signal; and
a mirror part provided on the image display part and configured to reflect a shape of an object,
wherein the image display part comprises:
a first base substrate;
a first electrode provided on the first base substrate;
a second electrode provided on the first electrode;
a light emitting layer provided between the first electrode and the second electrode;
a sealing layer covering the second electrode; and
an insulating layer provided on the sealing layer;
wherein the light emitting layer is configured to have a circular shape in a plan view and the mirror part is disposed on the insulating layer.

15. The mirror display device of claim 14, wherein the mirror part transmits at least a portion of a first light received from the image display part to the outside, and reflects at least a portion of a second light received from the outside.

16. The mirror display device of claim 14, wherein the mirror part comprises a mirror layer configured to reflect a shape of an object, and a distance between the light emitting layer and the mirror layer is constant in a plan view.

17. The mirror display device of claim 15, wherein the light emitting layer comprises an overlapping light emitting layer portion that overlaps the mirror layer; and a non-overlapping layer portion that does not overlap the mirror layer.

18. The mirror display device of claim 17, wherein in a plan view, the non-overlapping light emitting layer portion has a circular shape, and the overlapping light emitting layer portion has a ring shape.

19. The mirror display device of claim 17, wherein in a plan view, a width of the overlapping light emitting layer portion is constant.

20. The mirror display device of claim 14, further comprising:
- an image area configured to display the image; and
- a mirror area configured to reflect a shape of an object, wherein the image area has a circular shape in a plan view.

* * * * *